US006664626B2

(12) United States Patent
Matsumoto et al.

(10) Patent No.: US 6,664,626 B2
(45) Date of Patent: Dec. 16, 2003

(54) SEMICONDUCTOR DEVICE AND METHOD OF MANUFACTURING THE SAME

(75) Inventors: Nobuo Matsumoto, Kanagawa (JP); Jin Murayama, Miyagi (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 87 days.

(21) Appl. No.: 09/917,819

(22) Filed: Jul. 31, 2001

(65) Prior Publication Data

US 2002/0022341 A1 Feb. 21, 2002

(30) Foreign Application Priority Data

Aug. 1, 2000 (JP) ....................................... 2000-232825
Jun. 29, 2001 (JP) ....................................... 2001-197700

(51) Int. Cl.[7] ................................................ H01L 23/12
(52) U.S. Cl. ........................ 257/711; 257/222; 438/453
(58) Field of Search ................................ 438/424, 426, 438/434, 444, 453; 257/222, 233, 536, 699, 711, 731

(56) References Cited

U.S. PATENT DOCUMENTS 4,356,374 A * 10/1982 Noyori et al.
4,920,070 A * 4/1990 Mukai
6,450,621 B1 * 9/2002 Hayakawa

* cited by examiner

*Primary Examiner*—Phuc T. Dang
(74) *Attorney, Agent, or Firm*—Whitham, Curtis & Christofferson, P.C.

(57) ABSTRACT

An object of the present invention is forming a concave portion (including a penetration hole) in a semiconductor substrate by a sandblast method without causing electrostatic breakdown. In order to achieve the object, in a wafer in which at least two chips are formed, metal films are formed at least in the vicinity of circumferential portions of regions in which the concave portions (including penetration holes) of the respective chips are to be formed. In addition, the metal films are extended from the vicinity of the circumferential portions to ends of the respective corresponding chips. Further, the metal films are connected with each other through regions between the chips. The entire surface of the wafer including the metal films is masked, except for the regions in which the concave portions of the respective chips are to be formed. At least a portion of the metal films is grounded and then the concave portions are formed in the respective chips formed on the wafer by the sandblast method.

12 Claims, 6 Drawing Sheets

SEMICONDUCTOR DEVICE AND METHOD OF MANUFACTURING THE SAME

BACKGROUND OF THE INVENTION

1. Field of the Invention

The present invention relates to a semiconductor device in which a concave portion (including a penetration hole) is formed in a support substrate on which a semiconductor circuit is formed, by using a sandblast method, and a method of manufacturing the same.

2. Description of the Related Art

For example, when a recording head of a thermal inkjet printer is manufactured, a heater (heating resistor) material is laminated on a silicon substrate in which a driver circuit has been formed. Further, a cavity as an ink room for each pixel and an orifice nozzle as a discharge opening of ink are formed on the heater. Since the ink is supplied from the rear side surface of the silicon substrate, an ink supply hole (a penetration hole) which penetrates the silicon substrate is formed.

Generally, the above ink supply hole is formed from both side surfaces of the silicon substrate by using the sandblast method in view of a hole forming speed. In the sandblast method, as known well, a region except for a region to be dug is masked and then a particle with a small size, such as alumina, is blasted to a semiconductor device with a semiconductor wafer state at a predetermined rate. Thus, the silicon substrate and the structure formed thereon are mechanically removed.

By the way, in the sandblast method, the particle with a small diameter is blasted by a dry air. Thus, static electricity is produced by the friction between the particle and the air.

Therefore, there is the following problem in the case of a semiconductor (silicon) device in which the concave portion (including the penetration hole) has to be formed in the support substrate by the sandblast method. That is, since the statically electrified particle collides with the silicon device, the silicon device is electrified. Thus, there may be a case where electrostatic breakdown of the silicon device is caused due to this electrification.

SUMMARY OF THE INVENTION

An object of the present invention is to provide a semiconductor device in which the problems with the above related art are solved and a concave portion (including a penetration hole) is formed by a sandblast method in a support substrate on which a semiconductor circuit is formed, without causing the electrostatic breakdown, and a method of manufacturing the semiconductor device.

In order to achieve the above object, according to a first aspect of the present invention, there is provided a semiconductor device in a state of a chip, wherein the chip has a support substrate in which at least one concave portion is formed and a metal film which is formed in a region including a circumferential portion of the concave portion and an outside of the circumferential portion on the support substrate, wherein and the metal film formed in the circumferential portion of the concave portion and a vicinity thereof is extended to an end of the support substrate.

Preferably, the metal film is formed on at least one of a front side surface and a rear side surface of the support substrate.

Preferably, the semiconductor device is a recording head of a thermal inkjet printer.

Also, according to a second aspect of the present invention, there is provided a semiconductor device in a state of a wafer, wherein the wafer has at least two chips, each of the at least two chips has a support substrate in which at least one concave portion is formed and a metal film which is formed in a region including a circumferential portion of the concave portion and an outside of the circumferential portion on the support substrate, the metal film in the circumferential portion of the concave portion and a vicinity thereof is extended to an end of the support substrate, and respective metal films extended to ends of respective support substrates of the at least two chips are connected with each other through a region between the chips.

Here, the metal film is preferably formed on at least one of a front side surface and a rear side surface of the support substrate. In addition, the semiconductor device is a recording head of a thermal inkjet printer.

Also, according to a third aspect of the present invention, there is provided a method of manufacturing a semiconductor device, comprising, in a wafer in which a plurality of chips are formed, the steps of: forming a metal film on a support substrate of each of the plurality of chips at least in the vicinity of a circumferential portion of a region in which a concave portion in a corresponding chip is to be formed, the metal film being extended from the vicinity of the circumferential portion to an end of the corresponding chip, and respective metal films of the plurality of chips being connected with each other through a region between the plurality of chips; masking an entire surface of the wafer including the metal films, except for the regions of the plurality of chips in which the concave portions are to be formed, respectively; and grounding at least a portion of the metal films and forming the concave portion in each of the plurality of chips formed, respectively, on the wafer by a sandblast method.

Here, a protective film for improving an adhesion between the metal films and a material for masking the entire surface of the wafer is preferably formed on the metal films. Also, a resistance value between the metal films formed on the respective chips and a ground is preferably 50 MΩ or lower.

In addition, it is preferable that the metal film is formed on a front side surface of the support substrate and a formation of the concave portion is started from the front side surface of the support substrate. Alternatively, it is preferable that the metal film is formed on a rear side surface of the support substrate and a formation of the concave portion is started from the rear side surface of the support substrate. Alternatively, it is the metal films are formed on a front side surface and a rear side surface of the support substrate and a formation of the concave portion is started from the front side surface and the rear side surface of the support substrate.

DETAILED DESCRIPTION OF THE PREFERRED EMBODIMENTS

A semiconductor device and its manufacturing method of the present invention will be described in details based on a preferred embodiments shown in the accompanying drawings.

Figure 1:
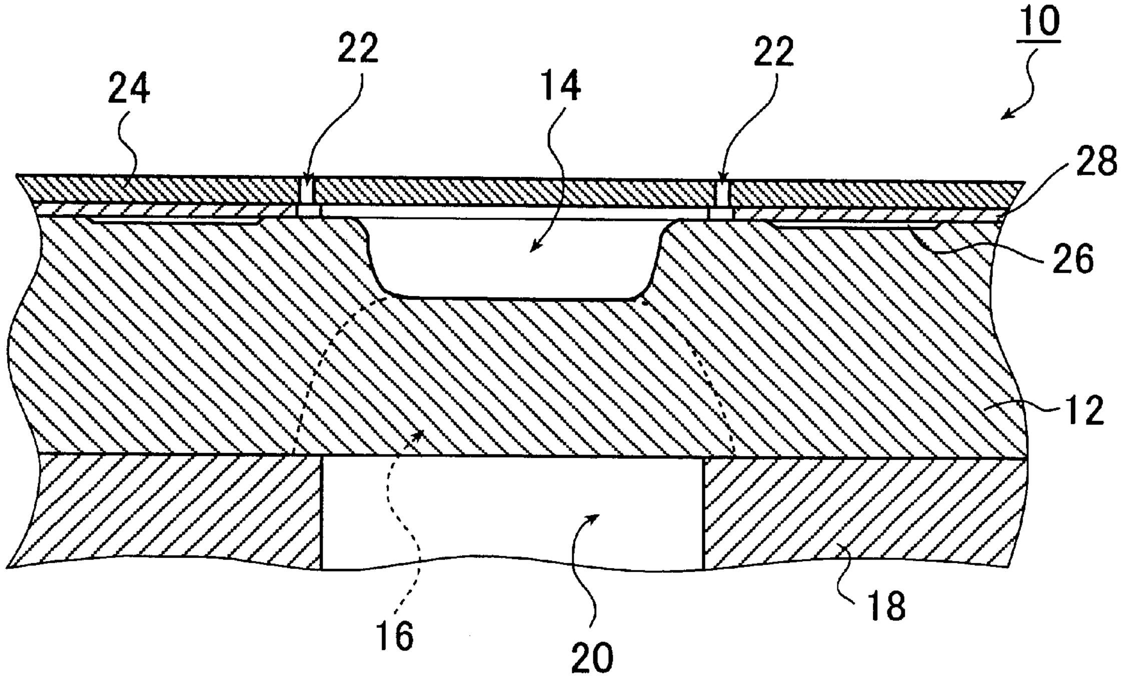
FIG. 1 is a cross sectional view showing one embodiment of a recording head of a thermal inkjet printer according to the present invention.

FIG. 1 is a cross sectional view showing one embodiment of a recording head of a thermal inkjet printer according to the present invention. This drawing shows a semiconductor device 10 of the present invention, to which the manufacturing method of the present invention is applied and which is manufactured by using a semiconductor manufacturing technique. In the semiconductor device 10, an ink groove 14 for supplying ink to a nozzle is formed in the center portion (in the drawing) of a semiconductor substrate 12 such as a silicon substrate so as to dig the silicon substrate 12 down from its surface and to extend the ink groove 14 in a direction vertical to the drawing paper surface.

In this ink groove 14, in order to supply the ink to the ink groove 14, a plurality of ink supply holes (penetration holes) 16 for connecting the rear surface of the silicon substrate 12 with the ink groove 14 are formed in the extension direction of the ink groove 14 at predetermined intervals. Note that a support frame 18 is a support member for locating the silicon substrate 12. In this support frame 18, an ink groove 20 for supplying the ink from an ink tank (not shown) to the ink groove 14 formed in the front side surface of the silicon substrate 12 through the ink supply holes 16 is formed.

In laterally symmetrical positions (in the drawing) sandwiching the ink groove 14, two nozzle columns in which a plurality of nozzles 22 are alternately arranged at regular intervals along the ink groove 14 are provided. The respective nozzles (orifices) 22 have a hollow circular shape and are formed in an orifice plate 24 which is laminated on the silicon substrate 12 and made of polyimide or the like. For example, in the case of 360 npi (nozzle per inch), with respect to the nozzle columns, the nozzles 22 are arranged in a direction vertical to the paper surface at a pitch of about 71 $\mu$m per column. Thus, a resolution of 720 npi can be realized by using these two columns.

Heat resistors (not shown) for controlling a discharge of ink from the respective nozzles 22 are formed over the silicon substrate 12 and under the nozzle columns. In addition, driver circuits 26 for driving the respective heating resistors are formed on the surface of the silicon substrate 12 outside the nozzle columns with the ink groove 14 as a center. A barrier wall 28 for forming an ink flow path for supplying the ink from the ink groove 14 to the respective nozzles 22 is formed between the surface of the silicon substrate 12 and the orifice plate 24.

The ink from the ink tank is passed through the ink groove 20 of the support frame 18, supplied to the ink groove 14 in the surface of the silicon substrate 12 through the ink supply holes 16 formed in the silicon substrate 12, and divided among the nozzle columns formed in both sides of the ink groove 14 through the ink flow path formed by the barrier wall 28. Then, the turning on and off of the respective heating resistors are controlled by the driver circuits 26 in accordance with image data and thus a predetermined amount of ink is discharged from the corresponding respective nozzles 22.

Next, a semiconductor device of the present invention will be described with reference to FIGS. 2A and 2B.

Figure 2A:
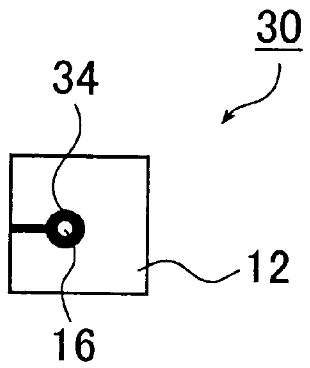
FIGS. 2A and 2B show concept views of one embodiment of a semiconductor device of the present invention as a semiconductor chip state and a semiconductor wafer state, respectively.
Figure 2B:
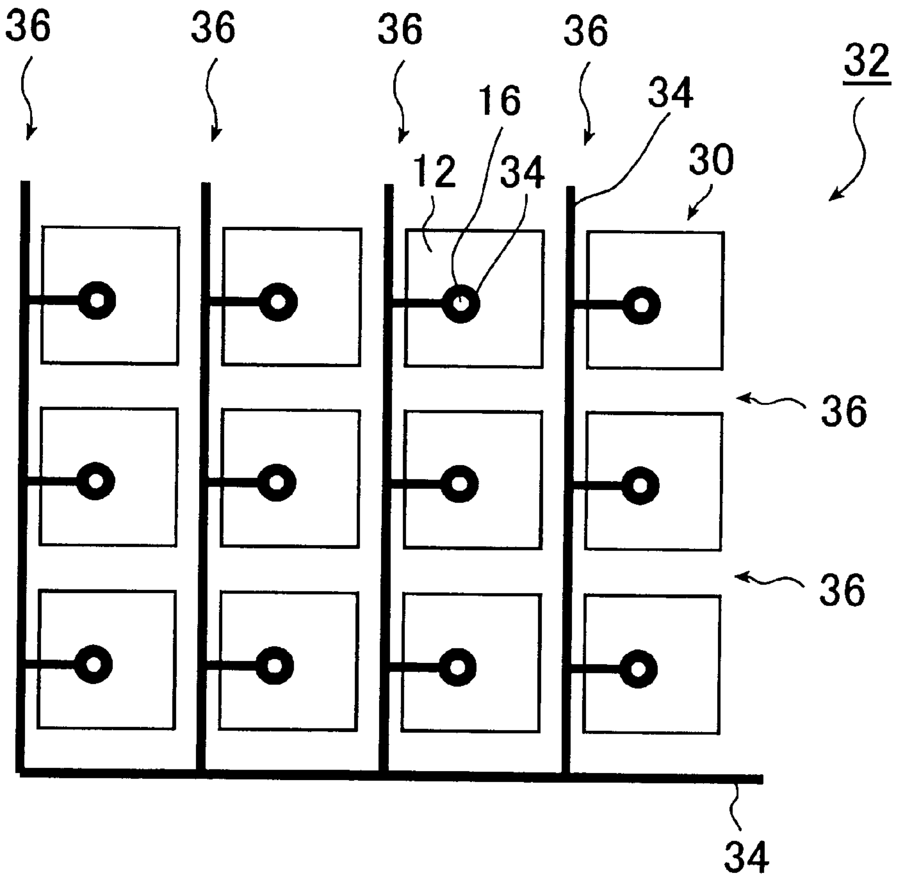

FIGS. 2A and 2B show concept views of one embodiment of a semiconductor device of the present invention.

These drawings conceptually show the semiconductor device of the present invention, which is manufactured using a semiconductor manufacturing technique in accordance with the semiconductor device manufacturing method of the present invention. FIG. 2A shows a semiconductor device as a semiconductor chip 30 state and FIG. 2B shows a semiconductor device as a semiconductor wafer (only a portion is shown) 32 state. Note that, in description below, the semiconductor device shown in FIGS. 2A and 2B are assumed as the semiconductor device 10 of the recording head shown in FIG. 1.

In case of the semiconductor chip 30 state, as shown in FIG. 2A, the semiconductor device of the present invention has a metal film 34. The metal film 34 is formed in a region that includes the circumferential portion of the ink supply hole 16 and the area outside the circumferential portion on the silicon substrate 12. In addition, the metal film 34 is extended to an end of the silicon substrate 12. As shown in FIG. 2B, in case of the semiconductor wafer 32, the metal films 34 extended to the ends of the silicon substrates 12 of the respective semiconductor chips 30 are connected with each other through a lead wire formed in regions (scribe lines) 36 between the respective semiconductor chips 30.

That is, a plurality of semiconductor chips 30 formed on the semiconductor wafer 32 will be separated by the scribe lines 36 to obtain the respective semiconductor chips 30. At this time, the lead wire formed on the scribe lines 36 in the state of the semiconductor wafer 32 as shown in FIG. 2B is removed in the state of the respective semiconductor chips 30 as shown in FIG. 2A. As a result, the metal film 34 extended from the circumferential portion of the ink supply hole 16 to the ends of the silicon substrate 12 remains.

Note that a shape of the ink supply hole 16, the number thereof, or the like is not limited.

In addition, it is preferable that the metal film 34 which is formed of the silicon substrate 12 of the region in the vicinity of the circumferential portion of the ink supply hole 16 completely surrounds the circumferential portion of the ink supply hole 16. However, the present invention is not limited to this, and the metal film 34 may be formed in at least a portion of the circumferential portion of the ink supply hole 16. That is, there is no problem even if a portion of the metal film 34 completely surrounding the circumferential portion of the ink supply hole 16 is not formed.

When more than two ink supply holes 16 are formed in one semiconductor chip 30, the metal film 34 is formed in the vicinity of the circumferential portion of the respective ink supply holes 16. Here, the metal film 34 formed in the circumferential portion of the respective ink supply holes 16 may be extended to the lead wire of the metal film 34 formed on the scribe line 36. Also, these metal films 34 are connected with each other on the semiconductor chip 30 and then one metal film 34 may be extended to the lead wire on the scribe line 36.

Hereinafter, a method of manufacturing of a semiconductor device of the present invention will be described with reference to FIGS. 3A to 3C and 4A to 4C.

Figure 3A:
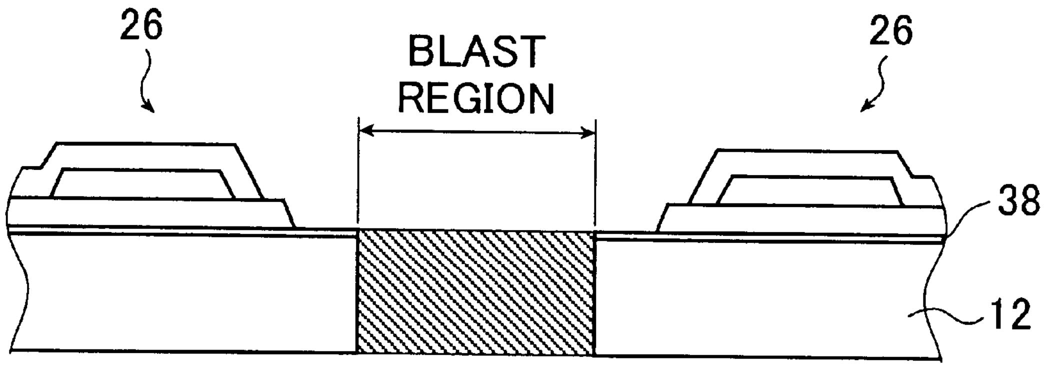
FIGS. 3A to 3C are cross sectional concept views of one embodiment showing a process for manufacturing the semiconductor device of the present invention.
Figure 3B:
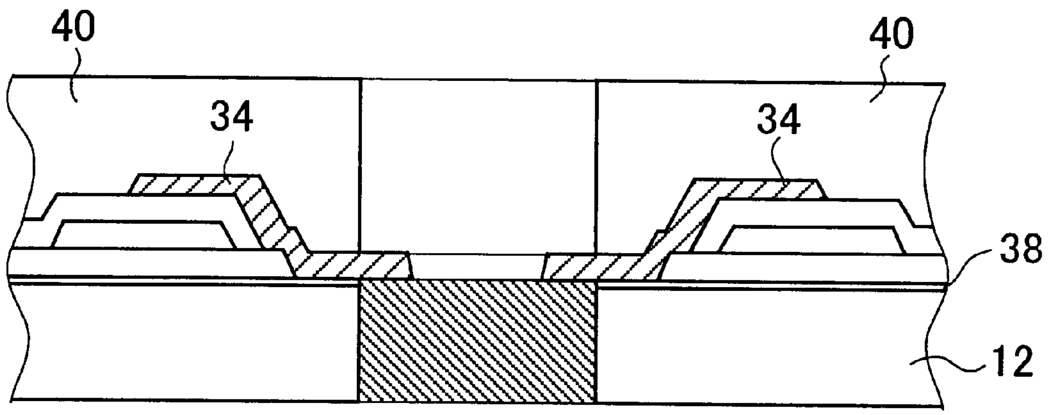
Figure 3C:
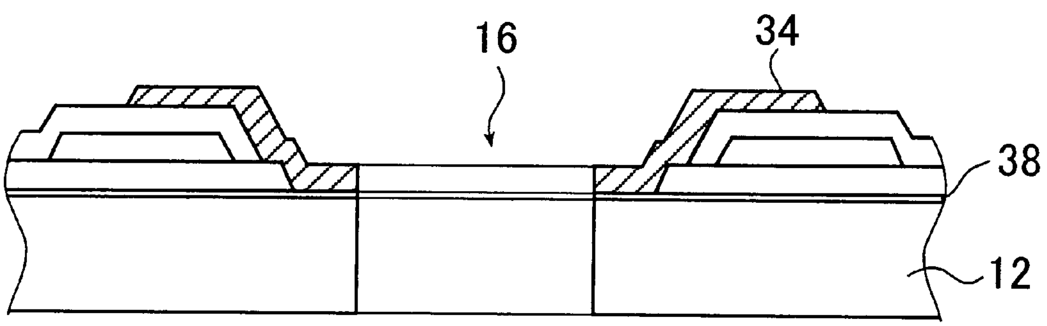

FIGS. 3A to 3C are cross sectional concept views of one embodiment showing a process for manufacturing a semiconductor device of the present invention.

These drawings are schematic cross sectional views showing a process for manufacturing the recording head of the thermal inkjet printer shown in FIG. 1 in the case where a silicon substrate is dug from its front side surface. A blast region shown in a middle portion of the silicon substrate 12 is a region that is dug by a sandblast method and becomes the ink supply hole.

Figure 4A:
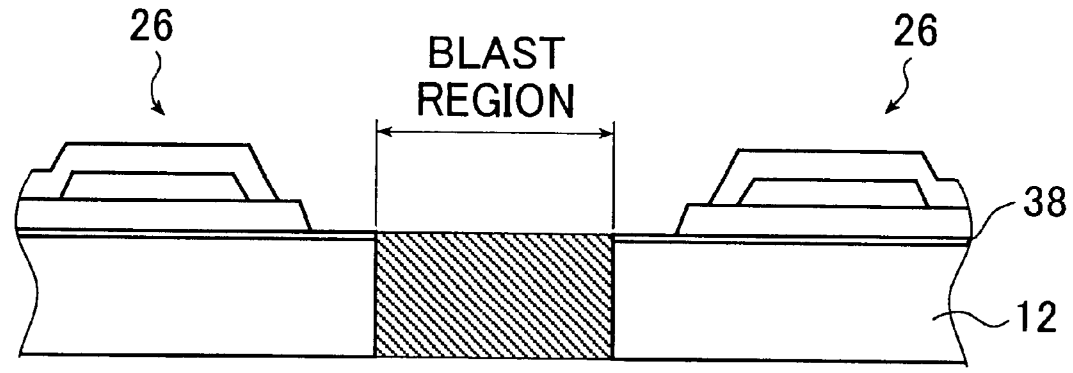
FIGS. 4A to 4C are cross sectional concept views of another embodiment showing a process for manufacturing the semiconductor device of the present invention.
Figure 4B:
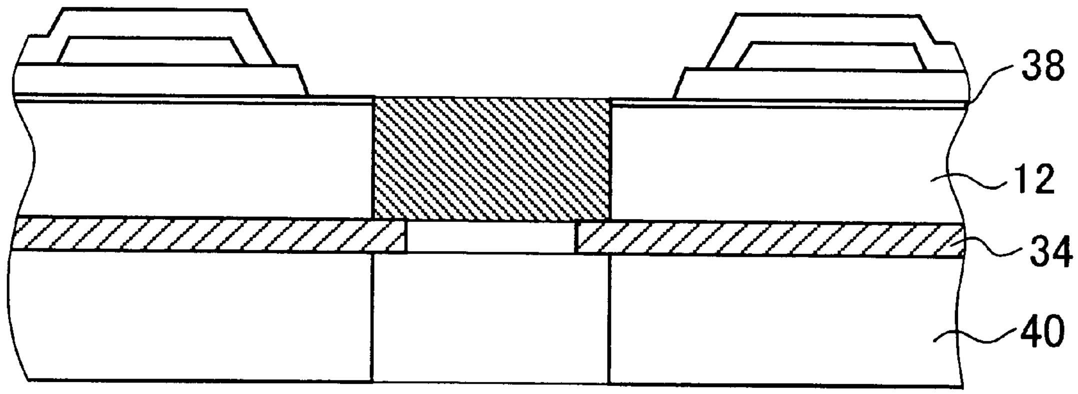
Figure 4C:
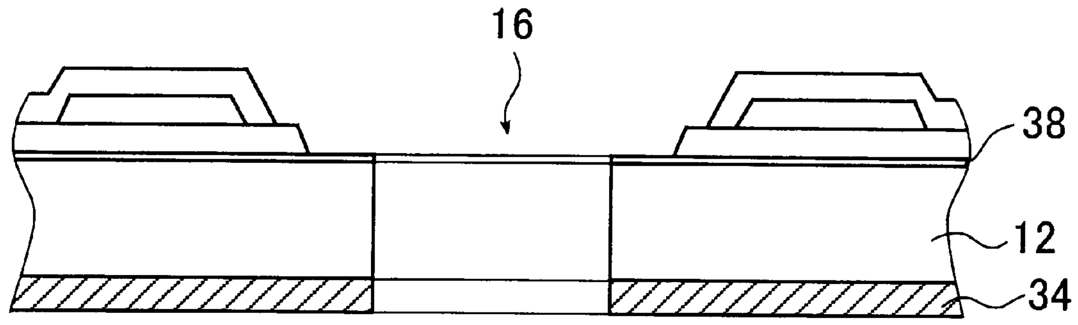

Also, FIGS. 4A to 4C are cross sectional concept views of another embodiment showing a process for manufacturing a semiconductor device of the present invention.

These drawings are schematic cross sectional views showing a process for manufacturing the recording head shown in FIG. 1 in the case where a silicon substrate is dug from its rear side surface. Note that the case of FIGS. 4A to 4C are identical with the case of FIGS. 3A to 3C except that the silicon substrate 12 is dug from its rear side surface to form the blast region. Thus, hereinafter, the case of FIGS. 3A to 3C will be described as a typical example.

FIG. 3A shows a state of a semiconductor device after driver circuits are formed on the silicon substrate. Here, a silicon oxide film 38 is formed on the front side surface of the silicon substrate 12. The driver circuits 26 are formed in regions on the both sides of the blast region that becomes the ink supply hole. Note that, in order to make the description easy, the example of a semiconductor device with a semiconductor chip state is shown in this drawing. However, a sandblast is basically performed for the semiconductor device with a semiconductor wafer state.

First, as shown in FIG. 3B, the metal film 34 is formed on the silicon substrate 12 of the vicinity of the circumferential portion of the blast region, and then a mask pattern 40 is formed using a photo resist (mask material) by a photolithography technique.

The metal film 34 is not limited to a specific film. However, it is preferable that metal used in a general semiconductor manufacturing process, such as Al, W, Ti, Mo, Ta, or Pt, or its alloy is used. Also, as shown in FIG. 3B, the metal film 34 is formed to cover the circumferential portion and its vicinity of the blast region that becomes the ink supply hole, that is, a region that is within a predetermined range in the inside and the outside of the circumferential portion of the blast region. However, the metal film 34 may be formed to cover the entire surface of the inside of the circumferential portion of the blast region.

As described above, in the inner portion of the respective semiconductor chips 30, the metal film 34 is formed to cover the region in the vicinity of the circumferential portion of the blast region. In addition, the metal film 34 is formed so as to be extended to the ends of the silicon substrate 12, as shown in FIG. 2A. In the entire semiconductor wafer 32, as shown in FIG. 2B, the metal films 34 extended to the ends of the silicon substrates 12 of the respective semiconductor chips 30 are formed to connect with each other through the scribe lines 36.

As described later, when the blast region is opened to form the ink supply hole by a sandblast method, this metal film 34 is kept in a state electrically connectable with a ground. For example, in the inner portion of the respective semiconductor chips 30, the metal film 34 may be connected with a ground line. Or, an extra common bonding pad or the like for a ground is formed on the semiconductor wafer 32, and then the metal film 34 may be connected with this bonding pad for a ground.

On the other hand, the mask pattern 40 is formed to cover the entire region except for the blast region that is opened by the sandblast method. Note that, in order to improve the adhesion between the metal film 34 and the mask pattern 40, a thin protective film having a thickness of 0.1 $\mu$m or less may be formed on the metal film 34. When the protective film has a thickness of 0.1 $\mu$m or less, this is instantly removed at the time of the sandblast to expose the surface of the metal film 34 while an amount of electrification is still small. Thus, the metal film 34 has the same effect regardless of the presence or absence of the protective film.

Subsequently, at least a portion of the metal film 34 formed on the semiconductor wafer 32 is made to be in contact with a support base for the semiconductor wafer 32 or the like to electrically connect the metal film 34 with a ground (earth connection). Then, the blast region is opened by the sandblast method from the front side surface of the silicon substrate 12. Thus, as shown in FIG. 3C, the ink supply hole 16 that penetrates the silicon substrate 12 from the front side surface to the rear side surface is formed. Note that, it is preferable that a resistance value between the metal films 34 formed on the respective semiconductor chips 30 and the ground is as small as possible, specifically 50 MΩ or lower.

Thus, the charge produced at the time of sandblast can be led to the ground through the metal films 34 that are formed on the semiconductor wafer 32 and commonly connected with each other. Therefore, without causing the electrostatic breakdown of the semiconductor device, the concave portion (including the penetration hole) can be formed in the respective semiconductor chips 30 formed on the semiconductor wafer 32. In addition, even if the electrification occurs on the region masked by the mask pattern 40, since the film thickness of the photo resist is large, hardly any problems are caused.

Note that, the metal films 34 which are shown in FIG. 3B and formed on a region inside the blast region, are removed together at the time of the sandblast, and thus the state as shown in FIG. 3C is obtained. FIG. 3C shows the state after the mask pattern 40 of the photo resist is removed. Thus, immediately after the ink supply hole 16 is opened and the mask pattern 40 is removed, the metal films are present on the silicon substrate 12 only outside the circumferential portion of the ink supply hole 16. An end surface of the metal films 34 in the circumferential portion of the ink supply hole 16 is exposed.

After the ink supply hole 16 is opened, the mask pattern 40 is removed and then a portion of the metal film 34 or the entire metal films 34 formed on the silicon substrate 12 may be removed. Alternatively, the entire metal film 34 is left without being removed and then a subsequent semiconductor manufacturing process may be continued.

The semiconductor device and its manufacturing method of the present invention are basically as the above.

Note that, with respect to the digging of the semiconductor substrate, using the sandblast method, the semiconductor substrate may be dug from one side surface thereof, that is, either the front side surface or the rear side surface. In addition, the semiconductor substrate may be simultaneously dug from both side surfaces thereof. Further, the semiconductor substrate may be dug from one side surface thereof until the middle of digging and subsequently may be dug form the other side surface thereof to completely dig it.

Therefore, the metal film may be formed on the front side surface, the rear side surface, or both side surfaces of the semiconductor wafer. When the metal film is formed on the rear side surface of the semiconductor wafer, it is not necessary to form the lead wire of the metal film along the scribe lines as in the case where the metal film is formed on the front side surface. Thus, the metal films formed in the circumferential portion and its vicinity of the blast region of the respective semiconductor chips may be connected with each other through the scribe lines in an arbitrary path.

The present invention can be applied to a recording head for a thermal inkjet printer using a semiconductor device, independent on a difference between a monochrome print and a color print. In this case, known various recording head structures such as a top shooter type (face inkjet) or a side shooter type (edge inkjet) can be used. In addition, the number of nozzle columns and the number of recording elements are not limited.

Also, the present invention is not limited to the recording head of the thermal inkjet printer and thus can be applied to a semiconductor device in which a concave portion (including the penetration hole) has to be formed in the semiconductor substrate by the sandblast method.

In the above embodiment, the example of the semiconductor device using the silicon substrate (semiconductor substrate) as the support substrate has been explained. However, the support substrate is not limited to the semiconductor substrate in which the semiconductor circuit has been formed on the silicon substrate and, for example, the semiconductor substrate such as SOI (Silicon on insulator) in which the semiconductor drive circuit has been formed on a glass substrate and the like may be used.

FIGS. 5A to 5C and FIGS. 6A to 6C are cross sectional concept views of another embodiment showing a process for manufacturing a semiconductor device of the present invention.

Figure 5A:
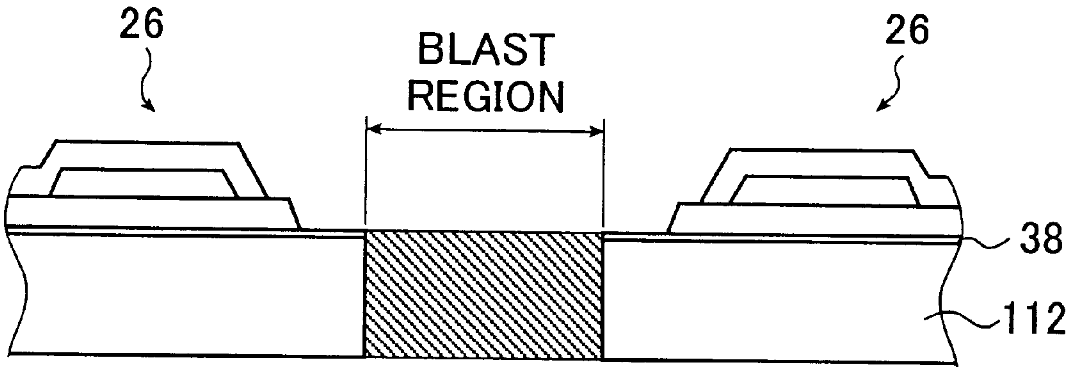
FIGS. 5A to 5C are cross sectional concept views of another embodiment showing a process for manufacturing the semiconductor device of the present invention.
Figure 5B:
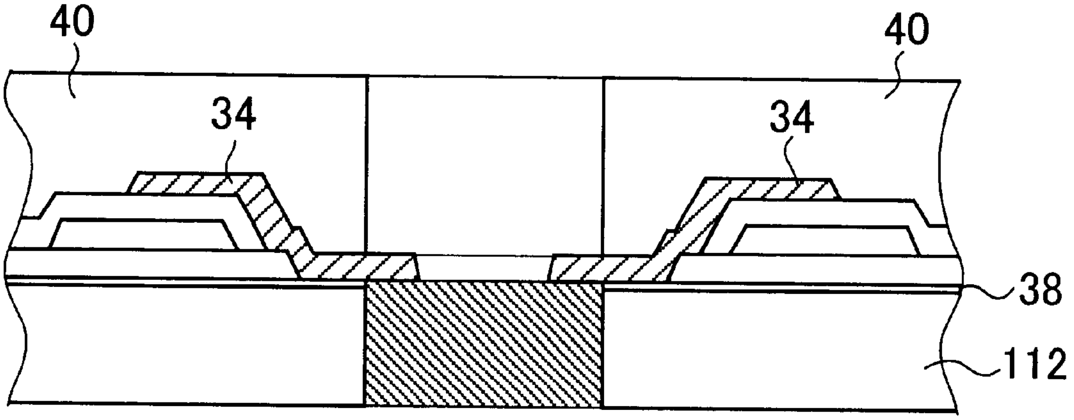
Figure 5C:
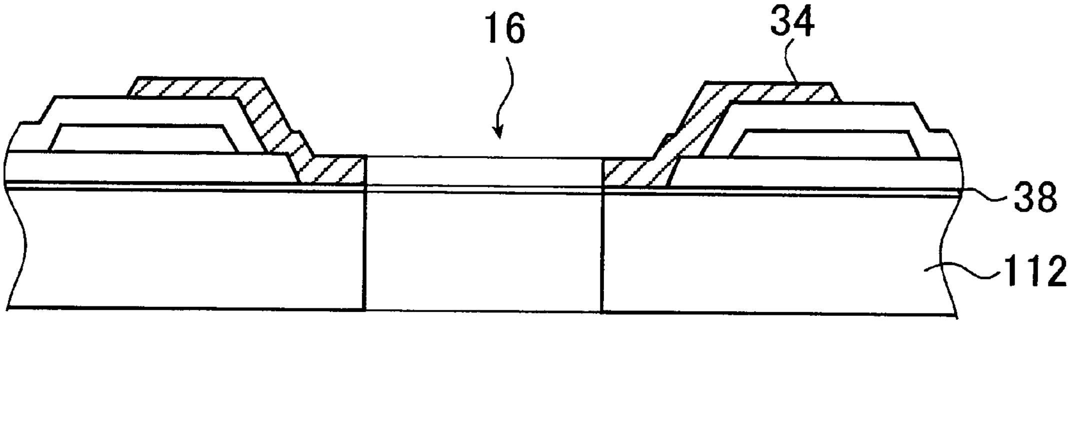
Figure 6A:
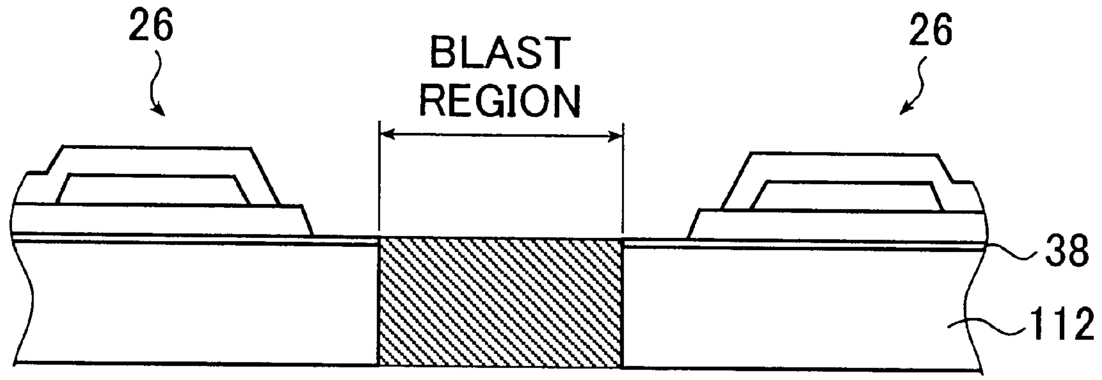
FIGS. 6A to 6C are cross sectional concept views of another embodiment showing a process for manufacturing the semiconductor device of the present invention.
Figure 6B:
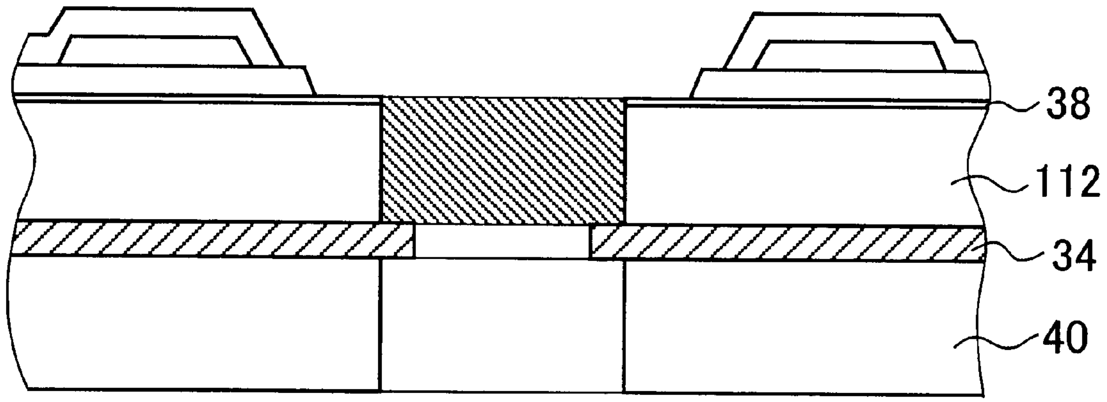
Figure 6C:
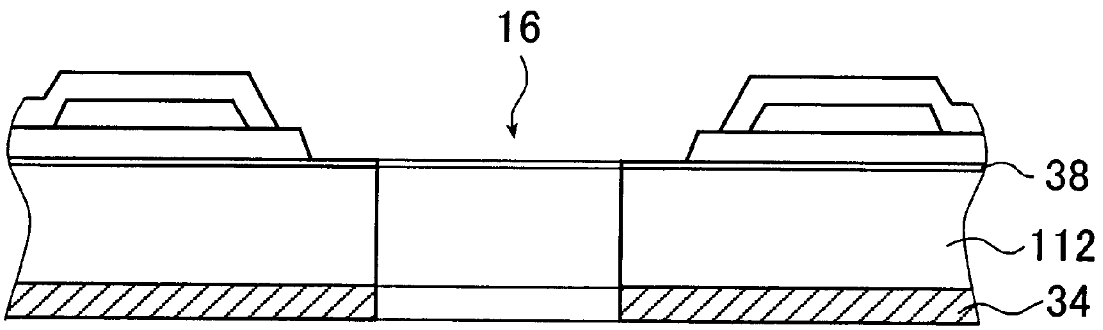

These drawings show a manufacturing process in the case where the semiconductor substrate in which the semiconductor circuit has been formed on the glass substrate 112 is used. FIGS. 5A to 5C are schematic cross sectional views showing a manufacturing process in the case where the glass substrate 112 is dug from its-front side surface of a recording head of a thermal inkjet printer. FIGS. 6A to 6C are schematic cross sectional views showing a manufacturing process in the case where the glass substrate 112 is dug from its rear side surface of the recording head of the thermal inkjet printer.

FIGS. 5A to 5C and FIGS. 6A to 6C correspond to FIGS. 3A to 3C and FIGS. 4A to 4C, respectively. Note that, FIGS. 5A to 5C and FIGS. 6A to 6C are different from FIGS. 3A to 3C and FIGS. 4A to 4C only in that the glass substrate 112 is used instead of the silicon substrate 12.

FIGS. 5A and 6A show the states of the semiconductor device after the driver circuits are formed on the glass substrate. Here, the silicon oxide film 38 is formed as an insulating film on the front side surface of the glass substrate 112. The driver circuits 26 are formed in the regions on the both sides of the blast region that becomes the ink supply hole.

Note that, since the semiconductor manufacturing process itself is identical to that shown in FIGS. 3A to 3C, the explanation of it is omitted here.

In this embodiment, things corresponding to the semiconductor wafer and the semiconductor chip are called a glass wafer and a glass chip, respectively. In addition, in the present invention, the semiconductor wafer, the glass wafer, and the like are generically called simply a wafer, and similarly the semiconductor chip, the glass chip, and the like are generically called simply a chip.

Although the semiconductor device and its manufacturing method of the present invention have been described above in detail, the present invention is not limited to the above embodiments, and various modifications may be naturally made in the scope not departing from the gist of the present invention.

As described above in detail, according to the present invention, the metal films are formed in the circumferential portion and its vicinity of the region in which the concave portion (including the penetration hole) of the chip is to be formed. Then, while the metal films are grounded, the concave portion is formed in the respective chips that are formed on the wafer by the sandblast method.

Therefore, according to the present invention, there is the effect that the electrostatic breakdown occurring when the concave portion is formed in the support substrate of the semiconductor device by using the sandblast method can be suppressed and thus the manufacturing yield of the semiconductor device can be improved. In addition, according to the present invention, even if a weak mask material is used for the sandblast, the metal film functions as a protective film for protecting a circuit located thereunder. Thus, there is an advantage that the manufacturing yield of the semiconductor device can be similarly improved.

What is claimed is:

1. A semiconductor device comprising:

a chip, having a support substrate;

a metal film formed on said support substrate in a region of the substrate in which at least one concave portion is formed in the substrate, a said metal film including an inside circumferential portion coincident with an edge of the concave portion and an outside circumferential portion, and wherein said outside circumferential portion of said metal film is extended to an end of said support substrate.

2. The semiconductor device according to claim 1, wherein said metal film is formed on at least one of a front side surface and a rear side surface of said support substrate.

3. The semiconductor device according to claim 1, wherein the semiconductor device is a recording head of a thermal inkjet printer.

4. A semiconductor device comprising:

a wafer having at least two chips, each of said at least two chips having a support substrate in which at least one concave portion is formed, and a metal film formed on said support substrate in a region of the concave portion, said metal film including an inside circumferential portion coincident with an edge of the concave portion and an outside circumferential portion, wherein said outside circumferential portion of said metal film is extended to an end of the support substrate, and respective metal films extended to ends of respective support substrates of said at least two chips are connected with each other through a region between said chips.

5. The semiconductor device according to claim 4, wherein said metal film is formed on at least one of a front side surface and a rear side surface of said support substrate.

6. The semiconductor device according to claim 4, wherein the semiconductor device is a recording head of a thermal inkjet printer.

7. The semiconductor device of claim 1, wherein the at least one concave portion is an ink supply hole.

8. The semiconductor device of claim 4, wherein the at least one concave portion is an ink supply hole.

9. The semiconductor device of claim 1, wherein the chip is a recording head of a thermal inkjet printer.

10. The semiconductor device of claim 4, wherein the waver is a recording head of a thermal inkjet printer.

11. A recording head of a thermal inkjet printer comprising:

a chip having a support substrate in which at least one concave portion is formed as an ink supply hole; and a metal film formed on said support substrate in a region including an inside circumferential portion coincident with an edge of the concave portion and an outside circumferential portion, and wherein said outside circumferential portion of said metal film is extended to an end of said support substrate.

12. A recording head of a thermal inkjet printer comprising:

a wafer having at least two chips, each of said at least two chips having a support substrate in which at least one concave portion is formed as an ink supply hole, and a metal film formed on said support substrate in a region of the concave portion, said metal film including an inside circumferential portion coincident with an edge of the concave portion and an outside circumferential portion, wherein said outside circumferential portion of said metal film is extended to an end of the support substrate, and respective metal films extended to ends of respective support substrates of said at least two chips are connected with each other through a region between said chips.

* * * * *

UNITED STATES PATENT AND TRADEMARK OFFICE

CERTIFICATE OF CORRECTION

PATENT NO. : 6,664,626 B2
DATED : December 16, 2003
INVENTOR(S) : Matsumoto et al.

It is certified that error appears in the above-identified patent and that said Letters Patent is hereby corrected as shown below:

Column 8,
Line 30, "a said metal film" should be replaced with -- said metal film --.

Signed and Sealed this

Fifteenth Day of June, 2004

JON W. DUDAS
*Acting Director of the United States Patent and Trademark Office*